United States Patent [19]
Dutta

[11] Patent Number: 5,450,447
[45] Date of Patent: Sep. 12, 1995

[54] ADAPTIVE VARIABLE-GAIN PHASE AND FREQUENCY LOCKED LOOP FOR RAPID CARRIER ACQUISITION

[75] Inventor: Santanu Dutta, Cedar Rapids, Iowa

[73] Assignee: Rockwell International Corporation, Seal Beach, Calif.

[21] Appl. No.: 954,640

[22] Filed: Sep. 30, 1992

[51] Int. Cl.⁶ .............................................. H04L 27/06
[52] U.S. Cl. ............................... 375/344; 375/345; 375/376; 455/234.1; 455/260; 455/182.2; 455/192.2; 331/11; 331/34; 331/1 A
[58] Field of Search .................. 375/97, 78, 120; 455/232.1, 234.1, 234.2, 260, 182.2, 183.2, 192.1, 192.2; 331/11, 34, 1 A, 40

[56] References Cited

U.S. PATENT DOCUMENTS

| | | | |
|---|---|---|---|
| 3,748,590 | 7/1973 | Gray | 331/12 |
| 3,768,030 | 10/1973 | Brown et al. | 331/12 |
| 4,074,207 | 2/1978 | Forsberg | 331/1 A |
| 4,354,277 | 10/1982 | Crackel et al. | 455/259 |
| 4,355,402 | 10/1982 | Kromer, III et al. | 375/98 |
| 4,367,444 | 1/1983 | Gardner et al. | 332/19 |
| 4,390,910 | 6/1983 | Wilson | 360/77 |
| 4,419,759 | 12/1983 | Poklemba | 357/97 |
| 4,454,604 | 6/1984 | Myers | 375/1 |
| 4,458,355 | 7/1984 | Matley et al. | 375/98 |
| 4,563,767 | 1/1986 | Brandt | 375/120 |
| 4,580,107 | 4/1986 | Caldwell et al. | 331/17 X |
| 4,626,845 | 12/1986 | Ley | 340/825.48 |
| 4,691,377 | 9/1987 | Yoshihara et al. | 375/98 |
| 4,855,689 | 8/1989 | Kinkel | 375/97 |
| 4,896,336 | 1/1990 | Henely et al. | 375/80 |
| 4,961,073 | 10/1990 | Drapac et al. | 455/343 |
| 5,124,671 | 6/1992 | Srivastava | 331/10 |
| 5,128,632 | 7/1992 | Erhart et al. | 331/16 |
| 5,220,466 | 6/1993 | Coker et al. | 360/46 |

OTHER PUBLICATIONS

A. Mileant and S. Hinedi, Analysis of Lock Detection in Costas Loops, Technical Support Package for NASA Tech brief, vol. 15, No. 7, Item No. 86, Jul. 1991, JPL Invention Report, NPO-18102/7612.

Charles R. Cahn, Improving Frequency Acquisition of a Costas Loop Dec. 1977, pp. 1453-1459.

*Primary Examiner*—Stephen Chin
*Assistant Examiner*—Amanda T. Le
*Attorney, Agent, or Firm*—Gregory G. Williams; M. Lee Murrah; George A. Montanye

[57] ABSTRACT

An apparatus and method for improving the performance of a satellite communications modem is disclosed. The invention is particularly applicable to mobile satellite receivers, and includes a variable-gain automatic frequency controlled (AFC) loop, the gain of which is controlled adaptively, based on the AFC lock status and the lock status of the modem's inner loop, in addition to other parameters determined by the invention.

17 Claims, 4 Drawing Sheets

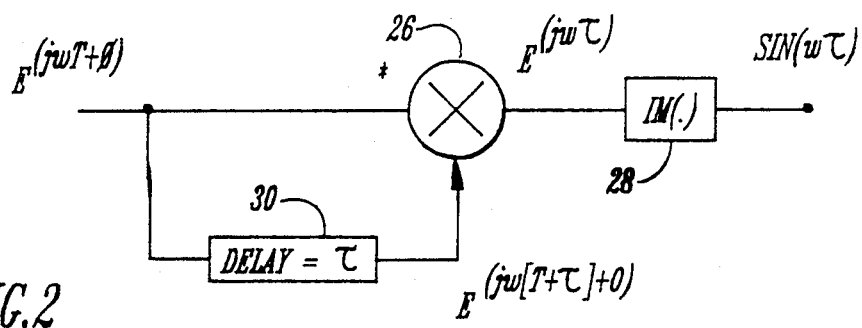
FIG.2 (PRIOR ART) FREQUENCY DISCRIMINATOR
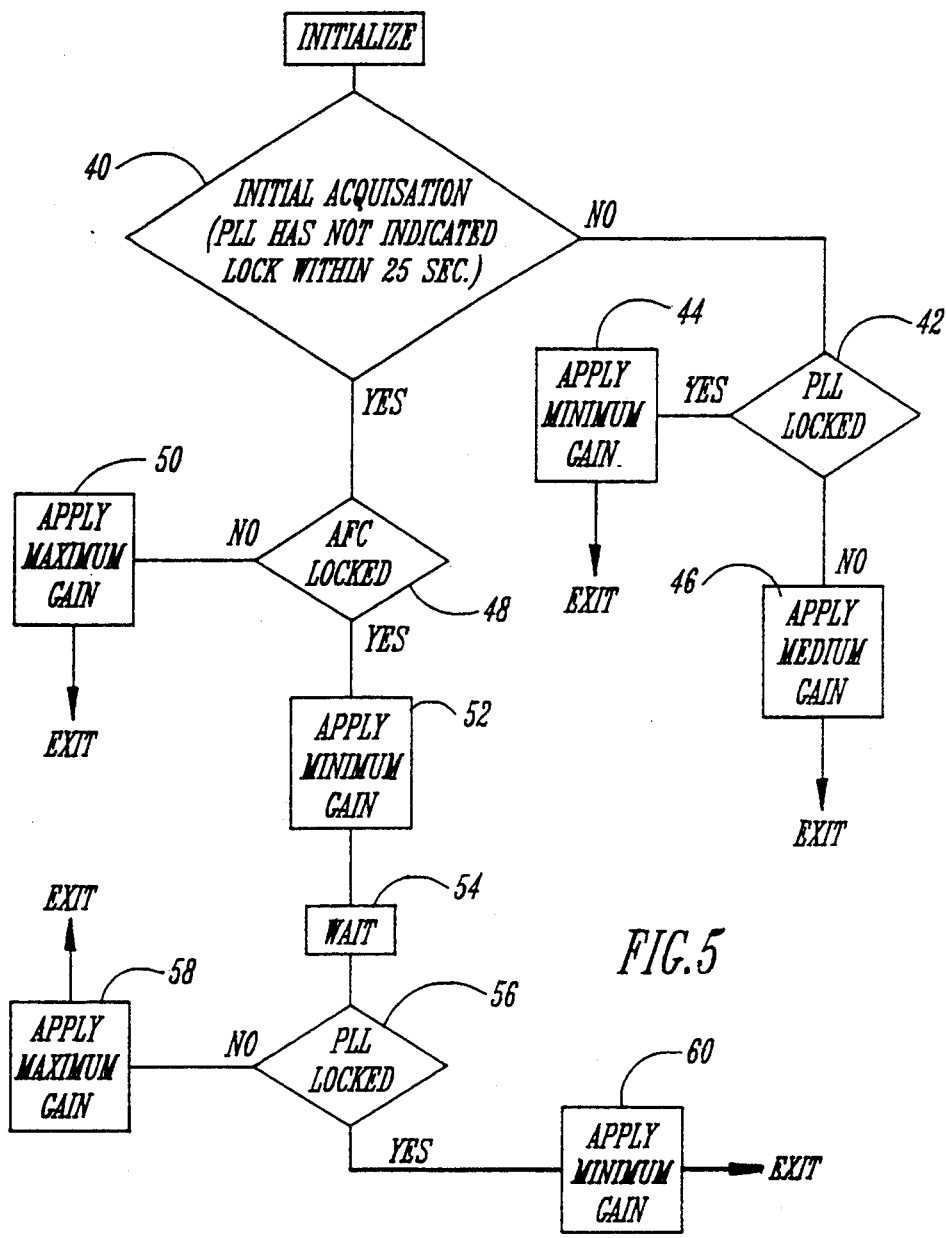
FIG.5

ADAPTIVE VARIABLE-GAIN PHASE AND FREQUENCY LOCKED LOOP FOR RAPID CARRIER ACQUISITION

INCORPORATION BY REFERENCE

The following materials are incorporated by reference herein: Improving Frequency Acquisition of a Costas Loop by Charles R. Cahn, IEEE Transactions on Communications, Vol. Com-25, No. 12, December 1977; Analysis of Lock Detection in Costas Loops by A. Mileant and S. Hinedi, Technical Support Package for NASA Techbrief, Vol. 15, No. 7, Item No. 86, July 1991, JPL Invention Report, NPO-18102/7612.

BACKGROUND OF THE INVENTION a. Field of the Invention

The present invention relates to satellite communication systems that use phase shift keyed (PSK) or differential phase shift keyed (DPSK) signalling. In particular, it relates to mobile satellite communications receivers which use PSK or DPSK signalling.

b. Problems in the Art

Many modulation schemes, e.g., PSK, DPSK, frequency shift key (FSK), single side band (SSB)-analog, and amplitude modulation (AM)-analog, require an accurate estimate of the system's carrier frequency for proper demodulation of the received signal. Demodulation of PSK and DPSK signals is particularly susceptible to a receiver's tuned frequency being offset from the desired carrier frequency. In addition to the carrier frequency, coherent-demodulation also requires estimation of the carrier phase. Generally, a Costas or squaring loop (which are more complex forms of the basic phase locked loop) provides the required estimate of carrier frequency and phase for coherent demodulation of PSK or DPSK signals. Unfortunately, Costas and squaring loops have only a limited capture range. To provide adequate loop demodulation performance, especially in low signal to noise ratio applications, the capture ranges of Costas and squaring loops must be limited. This is because the phase noise in the loop is proportional to the loop bandwidth which also governs the capture range. Consequently, Costas and squaring loops' capture ranges are often aided by supplemental means. One such means is spectral analysis of the received signal.

Spectral analysis of a mobile satellite system's received signal is sometimes employed to aid a loop in carrier acquisition. Spectral analyses are performed and averaged, yielding a coarse estimate of the receiver's frequency offset from the carrier. Although this approach will typically provide a frequency estimate within the loop's capture range, this approach requires a great deal of processing power. Applications involving low signal to noise ratio require even more processing because the desired signal is masked by noise and must be extracted using several Fast Fourier Transforms (FFTs) followed by averaging and some form of feature extraction. Processing power requirements severely limit the applicability of this approach to aiding loop acquisition.

Another approach to aiding phase locked loop (or PLL) acquisition employs a frequency locked loop to initially provide the primary correction and drive to the phase locked loop's VCO, when the offset between the frequency of the desired signal and that of the VCO is relatively large, and using the PLL's inherent capture ability when the offset is small.

In its most basic configuration, a Costas loop's capture range is comparable (about 1.5 times greater) to its single-sided loop noise bandwidth. One can extend the capture range of the basic loop considerably beyond the loop noise bandwidth by creating a component in the VCO's input drive that was proportional to the instantaneous frequency offset between the VCO's output and the input signal. Adding an automatic frequency control (AFC) loop around the Costas loop provides the desired VCO drive signal.

Although the addition of an AFC loop around the Costas loop increases the composite loop's capture range, the acquisition time of the composite loop is long because the AFC loop bandwidth has to be small relative to that of the Costas loop. This is so that the AFC loop's contribution to the VCO phase noise is small. In fact, in Cahn's work (referenced above and incorporated by reference herein), the AFC loop bandwidth is limited to 1/10 of the Costas loop bandwidth, at most. For slowly varying signals, in applications where channel utilization is not extremely critical, this bandwidth penalty is tolerable and, many times, the increase in capture range more than compensates for the sacrifice in loop bandwidth. However, for many applications, loop bandwidth is critical and this approach is untenable.

In particular, mobile satellite communication systems operate with low signal to noise ratios. Furthermore, the mobile satellite receiver typically "hops" its tuned frequency over a range of uncertainty until it locates its desired carrier frequency. This "hopping" effectively creates a step-function input to the carrier acquisition subsystem. A limited loop bandwidth constricts an acquisition system's response to a rapidly changing input like a step-function.

Satellite time is extremely expensive, and anything that reduces a satellite communication system's acquisition time enhances the utilization of a valuable resource. A technique for improving channel utilization through the reduction of acquisition time greatly improves the carrier acquisition system's value. Achieving this improvement is especially difficult when faced with the obstacles presented by a step function input in combination with a limited loop bandwidth.

It is therefore an object of the present invention to provide means and a method for minimizing the search time required for a satellite communication acquisition system to acquire an associated communication channel.

It is also an object of the present invention to minimize the time required for a mobile satellite receiver to reacquire a satellite signal after interruption. Such systems require narrow tracking bandwidths in order to provide good demodulation performance at low signal-to-noise ratios. Fading and blocking of signals cause mobile satellite systems to suffer much more frequently from the loss of carrier than stationary satellite systems. Rapid reacquisition is therefore especially important to mobile satellite systems.

It is a further object of the present invention to provide means and a method for acquisition and tracking of a satellite communication signal which is cost effective.

Some carrier acquisition subsystems use a computation intensive approach to expand the capture range of a phase locked loop. In these systems, high speed, relative costly processors continuously run Fast Fourier Transforms in the background. It is therefore a further object of the system of the present invention to eliminate the expense associated with high performance processing components by obviating the need for continuous Fast Fourier Transform computation.

It is a further object of the present invention to provide means and a method for extending the capture range of a PLL (phase locked loop), so that it can pull in signals with large frequency offsets, without degrading the signal to noise ratio in the tracking mode.

Other objects, features, and advantages of the invention will become apparent with reference to the accompanying specification and claims.

SUMMARY OF THE INVENTION

The present invention is an adaptive, variable AFC gain, phase locked loop, which aids both basic PLLs or PLLs extended to Costas or squaring loops by providing both a wide capture bandwidth during the PLL's initial acquisition and narrow loop noise bandwidth while the loop is tracking. In an embodiment where the PLL has been extended to a Costas or squaring loop, the resulting AFC aided PLL is suitable for demodulating mobile satellite PSK signals.

The system of the present invention sets the AFC loop gain to maximum during initial acquisition, to a medium level when the PLL is out of lock but nevertheless in the tracking mode, and to a minimum value when the PLL is locked or when the carrier synchronizer is in a waiting mode.

The system of the present invention estimates how far the loop's transient response is from its equilibrium point, provides a reliable AFC lock detection method and means, and discriminates between initial acquisition and tracking modes. Based on these results, the system of the present invention sets the AFC loop gain so as to minimize capture time (maximize capture bandwidth) and yet maintains the incoming signal's signal to noise ratio during tracking (by providing a narrow loop noise bandwidth). It is important to note that the system of the present invention bases AFC gain control, not on PLL lock, but on its own estimate, derived from transient response analysis of proximity of the VCO frequency to the input frequency. This estimate is at least one order of magnitude more rapid than one based on PLL lock alone.

BRIEF DESCRIPTION OF THE DRAWINGS

FIG. 2 is a detailed diagram of the frequency discriminator of FIG. 1.

FIG. 5 is a flowchart for the gain switching decisions for the system of the present invention.

DETAILED DESCRIPTION OF THE PREFERRED EMBODIMENT

Figure 1:
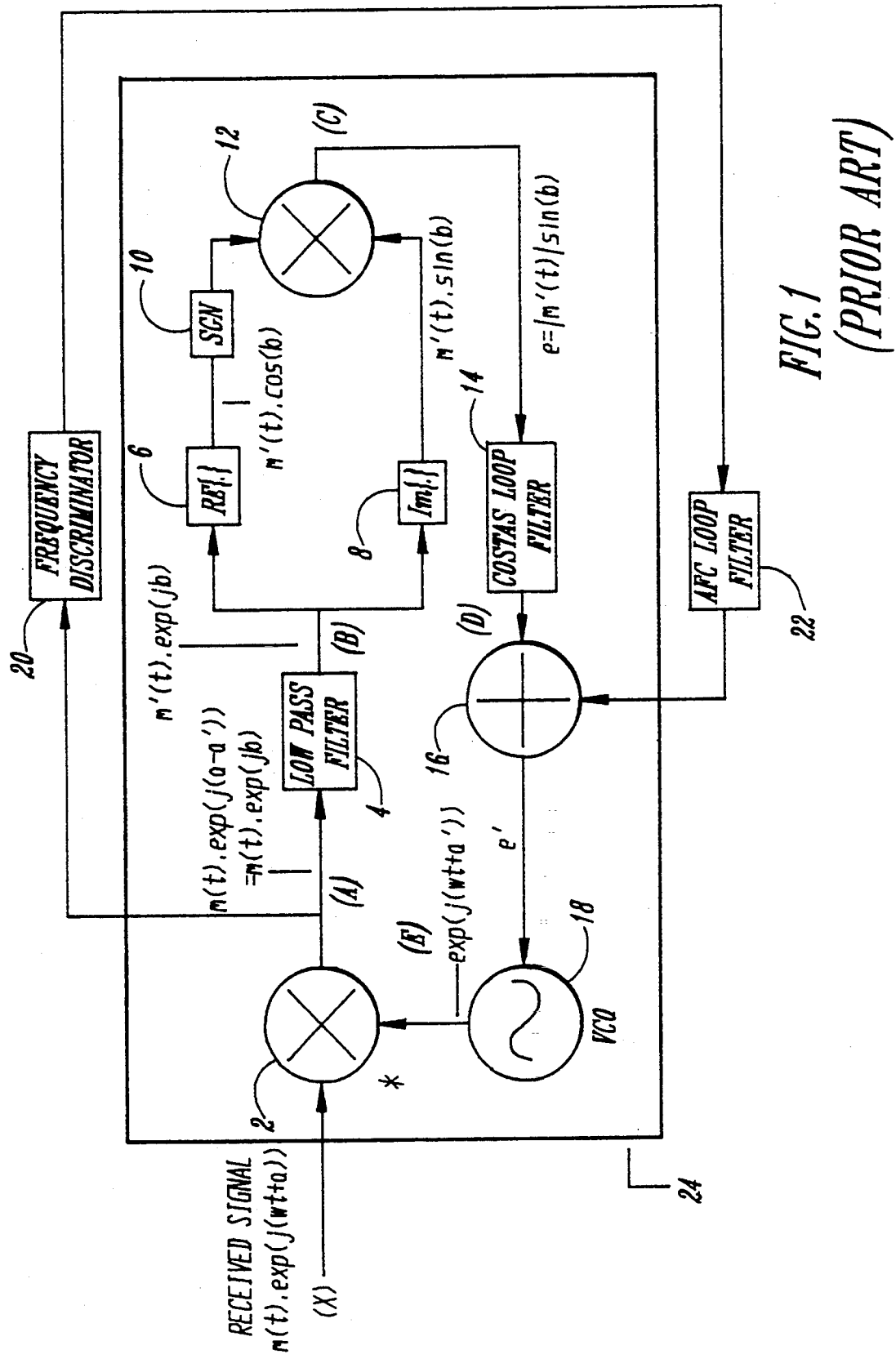
FIG. 1 is a block diagram of an AFC-aided Costas loop described by Cahn.

To assist in a better understanding of the present invention, a specific embodiment of the invention will now be set forth in detail. This description is not inclusive of all forms the invention may take, but is illustrative only.

Reference characters used throughout this description including numbers, letters and combinations of the same, refer to the appended drawings and are used to indicate specific parts or locations in the drawings. The same reference characters will be used for the same parts and locations throughout all the drawings unless otherwise indicated.

FIG. 1 is a block diagram of an AFC frequency discriminator-aided Costas loop. The input to the Costas loop is a complex base band signal consisting of inphase and quadrature components obtained by frequency translating the received bandpass intermediate frequency signal to a center frequency of 0 HZ. The input to the Costas loop can be written as:

$$(X) = m(t) \cdot exp\{j(wt + a)\}$$

where t is the time variable, m(t) is the real amplitude of the complex baseband input, w is the angular frequency in radians per second, and a is the phase offset relative to an arbitrary reference at the receiver. Because a nonfading channel is assumed for this discussion, "a" and "w" are represented as time invariant parameters.

To illustrate phase acquisition in a Costas loop, we first assume that frequency acquisition has been achieved, but that phase acquisition has not—that is, the VCO 18 output frequency (E) equals w but its phase is not equal to a. The VCO output is given by $(E) = exp\{j(wt + a')\}$.

Multiplier 2, multiplies the input signal, (X), by the complex conjugate of VCO 18 output (E). Resulting signal (A) equals m(t) exp(jb) where b is the phase error between VCO 18, output (E) and input (X):

$$\begin{aligned}
(A) &= (X) \cdot (E)^* \\
&= m(t) \cdot exp\{j(wt + a - wt - a')\} \\
&= m(t) \cdot exp\{j(a - a')\} \\
&= m(t) \cdot exp(jb)
\end{aligned}$$

Lowpass filter 4 filters the complex error signal (A) to obtain a reduced noise version (B) equal to m'(t)exp{jb}. The filter delay is assumed to be negligibly small, and therefore the phase error b is unchanged. (B) is then split into its real, m'(t) cos(b) 6, and imaginary m'(t) sin(b) 8, components. Hard limiter 10, produces a "1" output for one phase of the BPSK channel signal and a "−1" output for the other phase. Multiplier 12 then multiples m'(t) sin(b) times the hard limiter 10 output resulting in a signal $e(t) = |m'(t)| \cdot sin(b)$, which is the feedback loop error signal. The output of lowpass filter 14, the filtered error signal, is the Costas loop contribution to control of the VCO 18. The bandwidth of lowpass filter 14 is much less than that of lowpass filter 4. Lowpass filter 14 therefore almost completely determines the frequency and time response of the Costas loop.

The capture range of the Costas loop 24, just described, is typically slightly greater than the loop noise bandwidth. A frequency locked loop composed of frequency discriminator 20, and AFC loop filter 22, are added to the basic Costas loop to significantly expand the capture range of the Costas loop. Frequency discriminator 20 generates an output which is proportional to the frequency of the input signal; and AFC loop filter 22 averages modulation-induced phase transitions in the frequency discriminator 20 output to a mean value close to zero. The output of AFC loop filter 22, therefore, is proportional to the instantaneous frequency of the input signal, with the self noise caused by modulation-induced phase transitions reduced. The outputs of the AFC loop filter 22 and the Costas loop filter 14 are combined in adder 16 to form the composite VCO input $e'$. The VCO output frequency (in radians) is given by $w=k.e'$, k being a fixed loop gain factor.

FIG. 2 depicts frequency discriminator 20 in more detail. In operation, multiplier 26 multiplies the complex conjugate of its input $\exp\{jwt+\phi\}$ by a version of the input signal delayed by $\tau$, that is $\exp\{j(w(t+\tau)+\phi)\}$, yielding $\exp\{jw\tau\}$. Module 28 takes the imaginary part of this resulting signal to obtain $\sin(w\tau)$. For small values of the argument, $\sin(w\tau)$ is proportional to w. Thus, discriminator 20, produces an output proportional to the input frequency w. The primary function of the discriminator is to provide an output that generates a correctional force of one sign for positive frequency offsets and of the opposite sign for negative frequency offsets.

Adding the AFC loop to the Costas loop improves the capture range; however, the AFC loop bandwidth is limited to at most 1/10 the Costas loop bandwidth. If the AFC loop bandwidth is greater than 1/10 the Costas loop bandwidth, the AFC loop will contribute significantly to the VCO phase noise during tracking. This limitation on the AFC loop bandwidth is a significant drawback in applications where rapid carrier acquisition is required, such as when the receiver's local oscillator is varied over a range of frequency uncertainty to search for the desired signal. Satellite communication systems often employ this frequency search technique at the receiver, and the limited channel capacity of satellite communication systems places a premium on maximum utilization of available capacity. In order to achieve maximum utilization, the PLL-based receiver must acquire the satellite carrier as rapidly as possible. The bandwidth limitation imposed on the AFC loop in order to limit the phase noise power of the composite loop frustrates the goal of rapid acquisition.

The present invention compensates for the shortcomings of the prior art AFC-aided PLL design by employing a variable gain AFC. By setting the AFC gain high, the bandwidth of the composite PLL is greatly expanded, thereby maximizing channel usage. During other periods of operation, lower AFC gains are applied to minimize the AFC loop's contribution to the composite loop noise.

Figure 3:
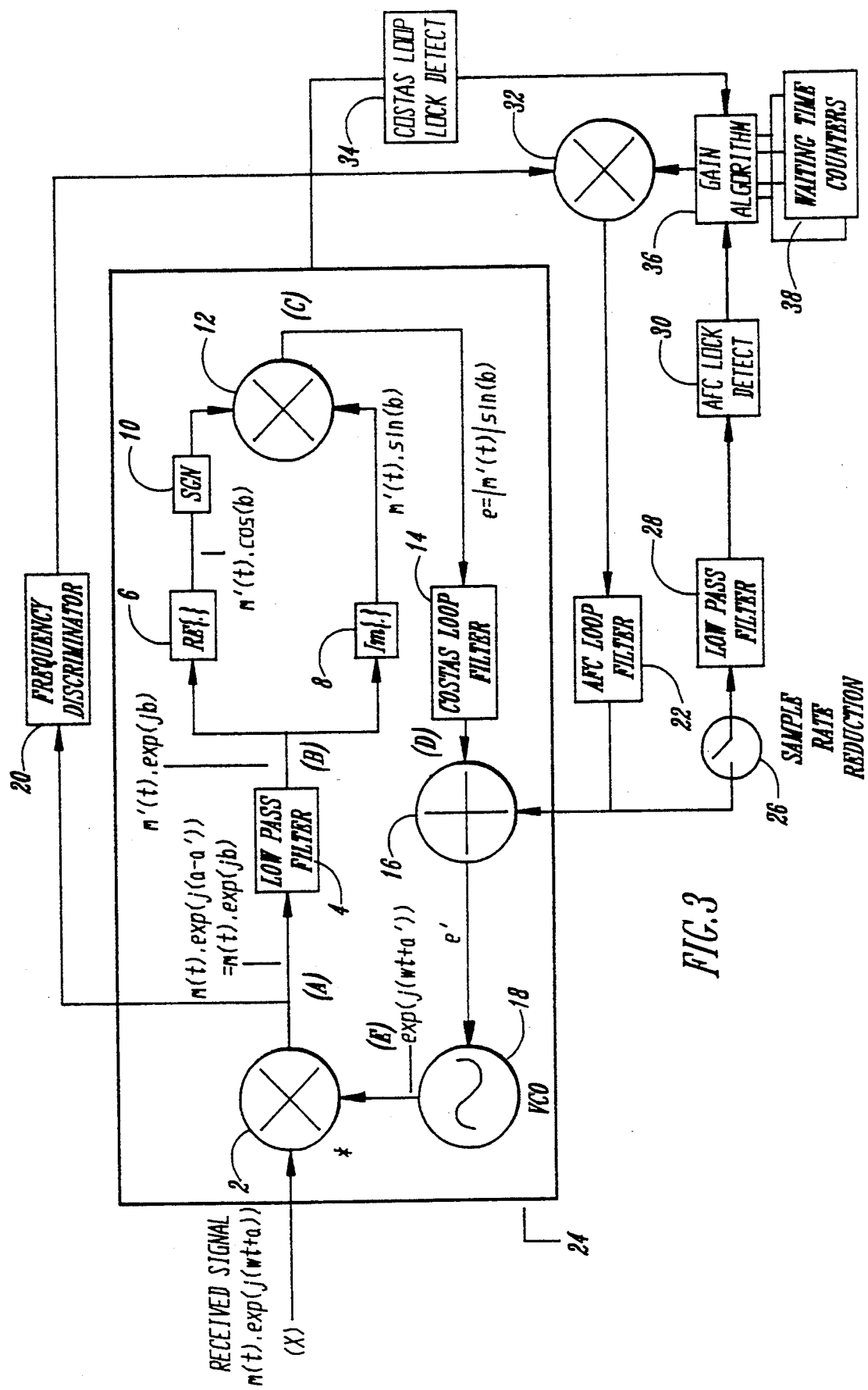
FIG. 3 is a block diagram of the preferred embodiment of the system of the present invention showing the adaptive AFC gain control.

FIG. 3 is a simplified block diagram of the preferred embodiment of the present invention. The elements, in addition to the prior AFC aided loop, include sample rate reduction module 26, lowpass filter 28, AFC lock detector 30, AFC gain multiplier 32, Costas loop lock detector 34, gain algorithm processor 36, and waiting time counters 38.

The addition of these elements provides the PLL with fast initial carrier acquisition, low phase noise during carrier tracking, fast carrier reacquisition after signal fading and blockages, and the ability to track time-varying Doppler shifts. A variety of measurements are developed and used by the above additional elements to control the AFC loop gain, thereby controlling bandwidth and noise in an optimal manner during the various states of PLL operation.

The two major modes of operation for the PLL of the present embodiment are, one, initial acquisition, and, two, tracking. The initial acquisition mode starts when a receiver tunes to a new channel and ends when the PLL first achieves lock. The tracking mode commences when the PLL first achieves lock. If the PLL is out of lock for a specified period (25 seconds in the present embodiment), the gain switching algorithm returns the PLL to the initial acquisition mode.

The flowchart of FIG. 5 illustrates the decision-making process of the gain switching algorithm and provides an overview of the operation of the present invention. After initialization, the processor running the algorithm determines whether the PLL is in the initial acquisition mode, decision block 40. The system is in the initial acquisition mode if the Costas loop has never acquired lock since the receiver tuned to the current frequency. The system reenters the initial acquisition mode if the Costas loop is continuously out of lock for 25 seconds. If the PLL is not in the initial acquisition mode, then it is in the tracking mode. After determining that the PLL is in the tracking mode, the PLL is checked in block 42 to determine whether it is locked. If the PLL is locked, then the minimum AFC gain is applied in block 44. If the PLL is not locked, however, then the medium gain is applied in block 46. The expectation here is that a temporary interruption has occurred in the signal reception and it is therefore not necessary to use the maximum AFC loop gain. However, the 25 second counter is started as soon as a loss of PLL lock is detected, and is reset when PLL lock returns. If the 25 second counter runs its full length, "initial acquisition" mode is declared, as mentioned above.

If it is determined at decision block 40, that the PLL is in the initial acquisition mode, the AFC loop is checked for lock. If the AFC loop is not locked, maximum gain is applied to the AFC loop in block 50. If the AFC loop is locked, the minimum gain is applied in block 52, and the processor waits a specified period (0.8 seconds in the present embodiment), during which the PLL is continuously checked for lock, as shown in block 56. If, at the end of the waiting period the PLL is not locked, maximum gain is applied in block 58, after which the processor exits the adaptive gain control module. If at block 56, the PLL is determined to be in lock, the minimum gain 60, is applied.

The AFC loop of the present invention uses a non-zero minimum gain in the tracking mode, thereby allowing a demodulator, for example, to track slow frequency drifts in the transmitter and receiver frequency references. The PLL rapidly resynchronizes after temporary loss of lock because the processor applies medium gain in this case. Since temporary loss of lock is most often due to fading or blocking of the signal, the frequency will not change significantly with a temporary loss of lock. Therefore, a medium gain level for the AFC loop is appropriate during temporary losses of lock.

The waiting period of block 54, and the initial acquisition timing of block 40, are implemented by counters 38 of FIG. 3. Costas loop lock detect 34 provides lock detection for decision blocks 56 and 42 of FIG. 5. The gain adjustments of blocks 44, 46, 50, 52, 58, and 60 are implemented by AFC gain multiplier 32 of FIG. 3. Costas loop lock detect, 34, is a standard lock detect implementation. (See, for example, the Mileant and Hinedi article incorporated by reference herein.) The AFC lock detect block 30, basically monitors the time derivative of the filtered AFC-loop error signal to determine when there is a change in its direction (increasing or decreasing). The direction is given by the first derivative of the filtered AFC error signal, and a change in direction is indicated by the product of two successive first derivatives being negative. In the digital signal processing (DSP) implementation used in the preferred embodiment, derivatives are implemented as finite differences.

Figure 4A:
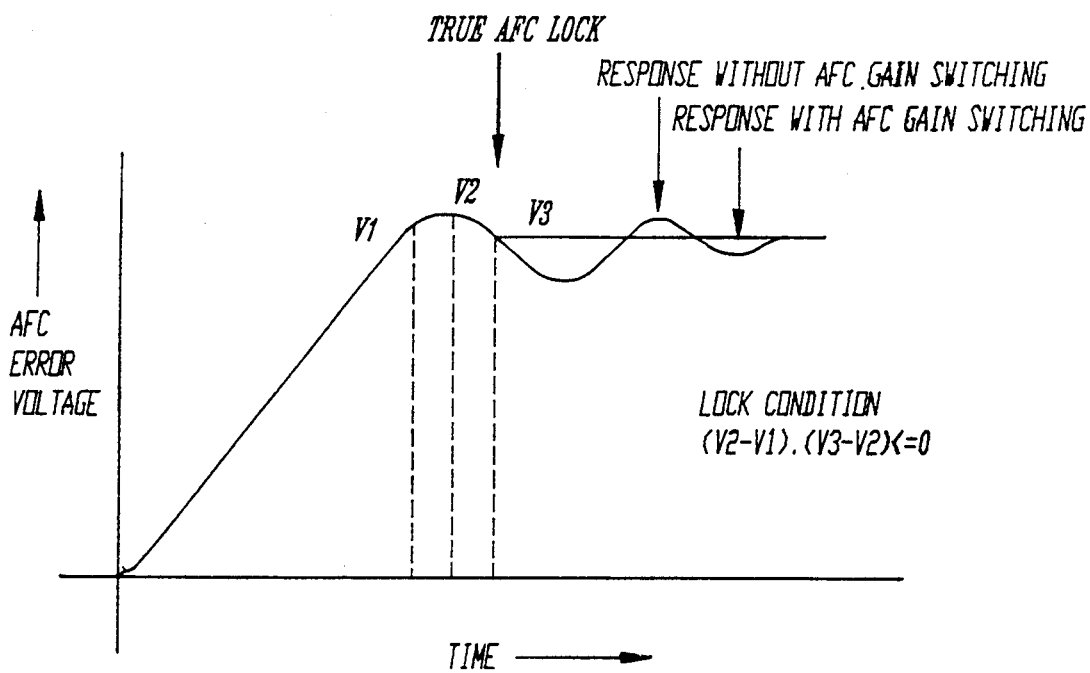
FIG. 4(a)-(b) illustrates the motivation for an AFC lock detection input to the adaptive AFC loop gain control mechanism of the present invention.
Figure 4B:
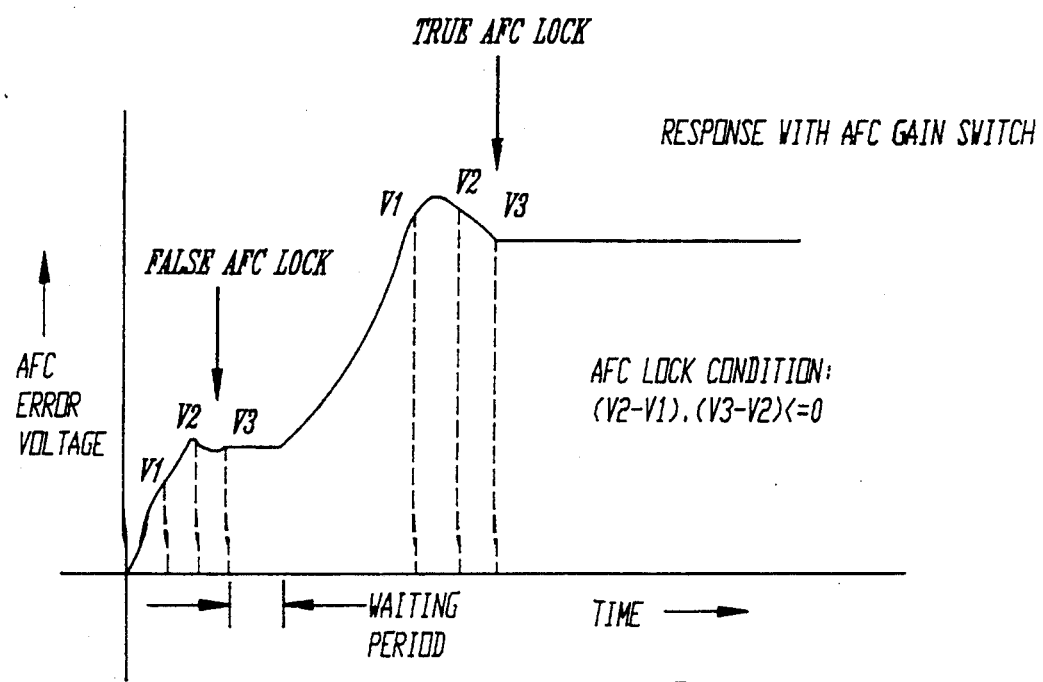

The sign change in the derivative of this signal provides an indication of the AFC loop's proximity to lock. This is a characteristic of the step response of any finite-bandwidth linear system, as illustrated in FIGS. 4A and 4B. This information is used, as explained above, by the AFC loop gain algorithm to set the proper gain at AFC gain multiplier 32.

FIGS. 4A and 4B illustrate the AFC loop lock detection process of the preferred embodiment of the present invention. The lock detector output is used, as explained above, to decide when to modify the AFC gain. A graphical representation of the AFC lock detection process is given in FIGS. 4A and 4B, which plot the filtered AFC error voltage (output of filter 28) as a function of time.

In operation, the gradient (time derivative) of the AFC error voltage is monitored for a change in sign. As shown in FIG. 4A, the output of 28 is sampled at three equally spaced instants to yield samples $V_1$, $V_2$, and $V_3$. When the transient response changes direction (i.e., gradient changes sign), the sign of $V_3-V_2$ is different from the sign of $V_2-V_1$. Therefore, whenever $(V_3-V_2) \times (V_2-V_1)$ is less than 0, the gradient has changed sign. This change in sign, as is apparent from FIG. 4A, is characteristic of the AFC error voltage waveform when the AFC nears lock.

There is, as illustrated in FIG. 4B, a chance that noise may induce a "false lock" indication on the part of the AFC lock detector. To mitigate the hazard of a false lock reading, the following three measures are taken.

First, the AFC error signal is lowpass filtered in block 28 in FIG. 3, before feeding it to the gradient determination module. The bandwidth of this filter is made as low as possible, limited by the required response time of the adaptive gain control system.

Second, the sample rate is decimated, in block 26, FIG. 3, thereby spacing the samples far enough apart that the likelihood of a noise-induced gradient sign reversal is reduced. For the preferred embodiment, the decimation factor was 100. Additionally, by reducing the sample rate in 26, before filtering in block 28, the implementation of lowpass filter 28, is simplified.

Finally, in low SNR conditions, spurious locks may occasionally occur in spite of the above measures. If after waiting for a predetermined time (0.8s in the preferred embodiment) after AFC lock, the PLL is not locked, then the system of the present invention determines that the AFC lock was false and returns the AFC gain level to that prior to the AFC lock detection. The waiting period is set long enough to allow the PLL to acquire a carrier from the edge of its capture range.

It will be appreciated that the present invention can take many forms and embodiments. The true essence and spirit of this invention are defined in the appended claims, and it is not intended that the embodiment of the invention herein set forth should limit the scope thereof.

For example, other implementations of the general principles of the present invention employed by the preferred embodiment set forth herein are possible. The AFC gain could be continuously variable, rather than discreet as set forth in the preferred embodiment. In such a embodiment, the AFC gain would be proportional to the gradient of the AFC error signal.

Although the present embodiment is based on DSP software, a hardware embodiment is also feasible and is especially attractive in high speed applications. Referring to FIG. 3, for example, multipliers 2, 12, and 32 could be four-quadrant analog multipliers; filters 28, 22, 4, and 14 could be analog filters; sampling means 26 could be placed after filter 28 and take the form of an A/D converter; and the AFC lock detect 30, and AFC gain algorithm 36, could be performed either in discreet digital hardware, a programmable logic device, or a microprocessor. In that case a D/A converter would be required between the AFC gain algorithm 36, and the AFC gain module 32, to convert the digital AFC gain value to an analog value. The PLL lock detect function could be a fully analog module whose output, fed to the AFC gain algorithm 36, is an on/off logic value.

Further, the system could be implemented in various custom, semi-custom or field programmable integrated circuits including gate arrays, programmable logic devices, etc. which may or may not incorporate both analog an digital functions within the same integrated circuit.

What is claimed is:

1. In a radio communication receiver, a carrier phase and frequency synchronizer that extends the capture range of a phase-locked-loop which is integral to the synchronizer, while maintaining low noise bandwidth of the synchronizer, comprising:

a phase locked loop generating a first error signal and having an oscillator controlled by a composite third error signal;

an automatic frequency control loop producing a second error signal;

means for combining the first error signal of said phase locked loop with the second error signal of said automatic frequency control loop and delivering the composite third error signal to the phase locked loop's oscillator;

means for controlling the gain of the automatic frequency control loop;

means for determining whether said phase locked loop is locked;

said means for determining having an output directed to said means for controlling the gain of said automatic frequency control loop;

means, independent of the said means for determining phase locked loop lock, for determining whether said automatic frequency control loop is locked and having an output directed to said means for controlling the gain of said automatic frequency control loop;

means for decimating the automatic frequency control loop error signal; and, means for filtering the decimated automatic frequency control loop error signal and having an output directed to said means for controlling the gain of said automatic frequency control loop.

2. The synchronizer of claim 1 wherein said phase-locked-loop is one of Costas or squaring phase locked loops.

3. The synchronizer of claim 1 wherein said automatic frequency control loop includes means for determining changes in the sign of the filtered decimated automatic frequency control error signal when said automatic frequency control loop is locked.

4. The synchronizer of claim 1 wherein said means for controlling the gain of the automatic frequency control loop comprises a microprocessor-based circuit.

5. The synchronizer of claim 1, wherein said means for controlling the gain of the automatic frequency control loop comprises a combination of analog and digital circuitry.

6. The synchronizer of claim 1 wherein said means for controlling the gain of the automatic frequency control loop comprises an application-specific integrated circuit.

7. In a radio communication receiver having a carrier synchronizer having a phase locked loop and an automatic frequency control loop; a method for carrier phase and frequency synchronization that extends the capture range of the carrier synchronizer, while maintaining the overall bandwidth of said synchronizer and preserving the input signal's signal to noise ratio, comprising:
   determining when said automatic frequency control loop is locked;
   determining when said phase locked loop is locked;
   determining whether said synchronizer is in an initial acquisition or tracking mode; and
   controlling the gain of said automatic frequency control loop based on whether said automatic frequency control loop is locked, whether said phase locked loop is locked, and whether said synchronizer is in an initial acquisition or tracking mode.

8. The method for carrier phase and frequency synchronization according to claim 7, further comprising:
   generating an automatic frequency control error voltage;
   decimating said automatic frequency control error voltage;
   filtering the decimated automatic frequency control error voltage;
   determining the slope of the filtered, decimated automatic frequency control error voltage;
   making an initial determination that the automatic frequency control is locked when the slope of the decimated, filtered automatic frequency control error voltage changes sign; and
   making a final determination that both said phase and frequency are synchronized when after waiting a predetermined period of time following said initial determination, said phase locked loop is determined to be locked.

9. The method for carrier phase and frequency synchronization according to claim 7 further comprising controlling the gain of said phase locked loop wherein the gain can take on a continuum of values.

10. The method for carrier phase and frequency synchronization according to claim 7 further comprising controlling the gain of said phase locked loop wherein the gain can take on discrete values.

11. The method for carrier phase and frequency synchronization according to claim 7 further comprising controlling the gain of said phase locked loop wherein the gain takes on a low but nonzero value during the tracking mode.

12. The method for carrier phase and frequency synchronization according to claim 7 further comprising controlling the gain of said phase locked loop wherein the gain takes on a high value during initial acquisition, a medium value when said phase locked loop is out of lock but nevertheless in the tracking mode, and a minimum gain when said phase locked loop is locked or when the carrier synchronizer is in the waiting mode.

13. In a radio communications receiver's carrier phase and frequency synchronizer, means for extending capture range of the synchronizer comprising:
   a phase locked loop;
   an automatic frequency control loop coupled to the phase locked loop through a common voltage controlled oscillator, fed by summed error signals of the phase lock loop and the automatic frequency control loop; and
   means for automatically switching automatic frequency control gain among various values.

14. A radio communication receiver wherein a carrier phase and frequency synchronizer incorporates a first feedback loop structure having an input signal, the synchronizer comprising:
   means for autonomously producing an estimate of a current operating point of said feedback loop structure relative to transient response of said first feedback loop structure and generating an estimate; and,
   means for verifying whether the estimate of the current operating point is true or false, based on a status of an independent indicator of the current operating point, where said independent indicator is independent of all parameters calculated in said first feedback loop.

15. The receiver of claim 14 wherein the means for autonomously estimating estimates the current feedback loop operating point by utilizing a gradient of an error signal produced in said feed back loop structure to determine proximity to an equilibrium value of the error signal.

16. The receiver of claim 14 wherein the means for verifying utilizes a predetermined waiting period, during which a status of the independent indicator is monitored.

17. The receiver of claim 14 wherein the independent indicator of the current operating point is a lock detector of a second feedback loop, operating with the same input signal as the first feedback loop.

* * * * *